(12) United States Patent
Hu et al.

(10) Patent No.: US 10,637,480 B1
(45) Date of Patent: Apr. 28, 2020

(54) MULTI-CONTROL QUANTUM STATE INVERSION GATE

(71) Applicant: International Business Machines Corporation, Armonk, NY (US)

(72) Inventors: Shaohan Hu, Yorktown Heights, NY (US); Dmitri Maslov, New Canaan, NY (US); Marco Pistoia, Amawalk, NY (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/394,171

(22) Filed: Apr. 25, 2019

(51) Int. Cl.
*H03K 19/195* (2006.01)
*H03K 19/20* (2006.01)
*G06N 10/00* (2019.01)

(52) U.S. Cl.
CPC ........... *H03K 19/195* (2013.01); *G06N 10/00* (2019.01); *H03K 19/20* (2013.01)

(58) Field of Classification Search
None
See application file for complete search history.

(56) References Cited

U.S. PATENT DOCUMENTS

| | | | |
|---|---|---|---|
| 8,244,662 B2 | 8/2012 | Coury et al. | |
| 9,317,473 B2 | 4/2016 | Yao et al. | |
| 9,379,303 B2 | 6/2016 | Gambetta et al. | |
| 10,069,573 B2 | 9/2018 | Krovi et al. | |
| 2016/0328253 A1 | 11/2016 | Majumdar | |
| 2018/0181685 A1 | 6/2018 | Roetteler et al. | |
| 2018/0218279 A1 | 8/2018 | Lechner et al. | |
| 2018/0232652 A1 | 8/2018 | Curtis et al. | |
| 2018/0314969 A1* | 11/2018 | Thornton | G06N 10/00 |
| 2019/0213493 A1* | 7/2019 | Cortese | G06N 10/00 |
| 2019/0220782 A1* | 7/2019 | Chen | G06N 5/003 |

OTHER PUBLICATIONS

Daniel Litinski et al., Lattice Surgery with a Twist: Simplifying Clifford Gates of Surface Codes, Apr. 17, 2018.

* cited by examiner

*Primary Examiner* — Jany Richardson
(74) *Attorney, Agent, or Firm* — Garg Law Firm, PLLC; Rakesh Garg; Keivan Razavi

(57) ABSTRACT

In a quantum circuit, an inversion gate is implemented with two controls each connected to a control qubit. In the quantum circuit responsive to determining that each control of the inversion gate is currently connected to a control qubit, an ancilla gate is implemented, a first control of the ancilla gate connected to a control qubit moved from a first control of the inversion gate, a second control of the ancilla gate connected to a control qubit selected from the set of unplaced control qubits, a target of the ancilla gate connected to the first control of the inversion gate. At a gate implemented in the quantum circuit responsive to determining that the gate has a maximum number of controls not connected to control qubits, a control of the gate is connected to a control qubit selected from the set of unplaced control qubits.

20 Claims, 15 Drawing Sheets

FOUR - CONTROL SYMBOLIC LAYOUT 710

```
C—A—C
 —T—
C—A—C
```

SIX - CONTROL SYMBOLIC LAYOUT 1120

```
C—A—C    C
 —         —
 A—T—A
 —         —
C—A—C    C
```

EIGHT - CONTROL SYMBOLIC LAYOUT 1130

```
C—A—C    C—A—C
 —         —
 A—T—A
 —         —
C—A—C    C—A—C
```

N - CONTROL SYMBOLIC LAYOUT 1140

MULTI-CONTROL QUANTUM STATE INVERSION GATE

TECHNICAL FIELD

The present invention relates generally to a method, system, and computer program product for quantum programming. More particularly, the present invention relates to a method, system, and computer program product for a multi-control quantum state inversion gate.

BACKGROUND

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational operations. In the particular realms where quantum mechanics operates, particles of matter can exist in multiple states—such as an "on" state, an "off" state, and both "on" and "off" states simultaneously. Where binary computing using semiconductor, processors is limited to using just the on and off states (equivalent to 1 and 0 in binary code), a quantum processor harnesses these quantum states of matter to output signals that are usable in data computing. Herein, a qubit is the physical carrier of quantum information. A qubit is the quantum version of a bit in classical computing, and can have quantum states of $|0\rangle$, $|1\rangle$, or the linear combination of both.

Quantum computing can often be used to solve problems more quickly than in conventional computing. For example, one quantum algorithm is Grover's Search, which accomplishes searching through an unordered list of N items with fewer lookups than is the case in conventional computing.

Quantum gates are the elementary building blocks for quantum computation, acting on qubits the way classical logic gates act on bits, one and two at a time, to change qubit states in a controllable way. An X gate inverts the state of a single qubit, much like a NOT gate inverts the state of a single bit in classical computing. An H gate, or Hadamard gate, puts a single qubit into a state of superposition, a combination of the 0 and 1 quantum states. The qubit only resolves to a definite state when measured. For example, when provided with an input having a quantum state of 0, within the Hadamard gate the quantum state is in superposition, but the output has a 50 percent probability of being in the quantum 0 state and a 50 percent probability of being in the quantum 1 state. Other single-qubit gates alter the qubit state in other defined ways.

Multi-qubit gates implement gates that perform conditional logic between qubits, meaning the state of one qubit depends on the state of another. For example, a Controlled-NOT, or CNOT gate, has two qubit inputs, a target qubit and a control qubit. If the control qubit is in the $|1\rangle$ quantum state, the CNOT gate inverts the state of the target qubit. If the control qubit is in the $|0\rangle$ quantum state, the CNOT gate does not change the state of the target qubit.

Multiple qubits can also be entangled. Two or more qubits are entangled when, despite being too far apart to influence one another, they behave in ways that are individually random, but also too strongly correlated to be explained by supposing that each object is independent from the other. As a result, the combined properties of an entangled multi-qubit system can be predicted, but the individual outcome of measuring each individual qubit in such a system cannot.

Similar to conventional computing, quantum computing gates can be assembled into larger groups, called quantum circuits, to perform more complicated operations. For example, a SWAP gate, which exchanges the states of a pair of qubits, can be constructed from three CNOT gates.

Quantum circuits can perform some operations in parallel, and some in series. The length of the longest series in the program is also referred to as the depth of the quantum circuit. For example, the three CNOT gates comprising a SWAP gate are arranged in series, giving a depth of 3. Programs with a shallower depth take less execution time and provide better performance, so are preferred.

A multiple-control inversion gate (also referred to herein as an inversion gate) is a generalization of a CNOT gate. A CNOT gate has one control qubit, used to control the state of a target qubit. In contrast, a multiple-control inversion gate has more than one control qubit. If all of the control qubits are in the $|1\rangle$ quantum state, the multi-control inversion gate inverts the state of the target qubit. If any of the control qubits is not in the $|1\rangle$ quantum state, the gate does not change the state of the target qubit. A multiple-control inversion gate is also known as a Toffoli gate. Inversion gates are key components in Grover's Search and other useful quantum processing algorithms.

SUMMARY

The illustrative embodiments provide a method, system, and computer program product. An embodiment includes a method that implements, in a quantum circuit, an inversion gate, the inversion gate configured to invert a quantum state of a target input if every control is in a $|1\rangle$ quantum state, the inversion gate having two controls, the controls each connected to a control qubit selected from a set of unplaced control qubits. An embodiment implements, in the quantum circuit responsive to determining that each control of the inversion gate is currently connected to a control qubit, a first ancilla gate, the first ancilla gate comprising an inversion gate, a first control of the first ancilla gate connected to a control qubit moved from a first control of the inversion gate, a second control of the first ancilla gate connected to a control qubit selected from the set of unplaced control qubits, a target of the first ancilla gate connected to the first control of the inversion gate. An embodiment connects, at a gate implemented in the quantum circuit responsive to determining that the gate has a maximum number of controls not connected to control qubits, a control of the gate to a control qubit selected from the set of unplaced control qubits.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

Certain novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
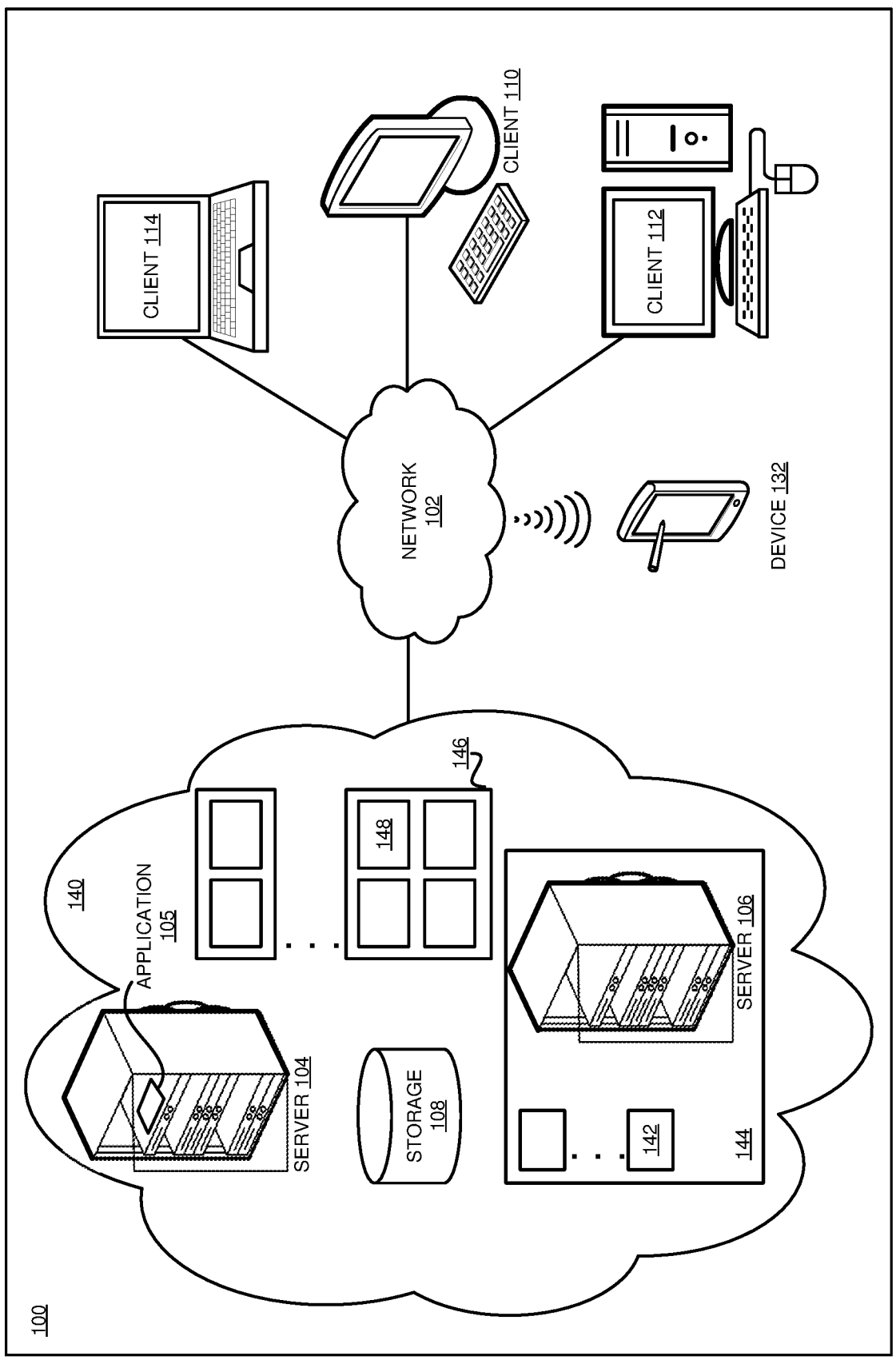
FIG. 1 depicts a block diagram of a network of data processing systems in which illustrative embodiments may be implemented.

The illustrative embodiments recognize that a currently used implementation of a multiple-control inversion gate in a quantum circuit relies on decomposing the multiple-control gate into physically implementable single-qubit gates and two-qubit CNOT gates, creating pairwise entangling interactions among the control qubits and the target. However, in currently-used quantum processor architectures not all qubits can interact with each other. Consequently, implementing pairwise entangling interactions may require additional operations such as SWAP gates to move a quantum signal from one qubit to another. The additional operations add both additional gates and additional circuit depth to a resulting quantum circuit. However, a quantum circuit with a larger number of gates and a higher depth generally takes longer to execute, on the same quantum processor, than a circuit with fewer gates and a smaller depth.

The illustrative embodiments also recognize that because current quantum processors do not include an error correction capability, qubit errors caused by circuit noise accumulate during circuit execution, with errors increasing as execution time increases. Thus, a quantum circuit must have a small enough gate count and small enough depth to complete execution before noise-induced qubit errors make the results unusable.

Presently used implementations and configurations of one or more Toffoli gates are used as some non-limiting examples to describe certain operations and functions of various embodiments. From this disclosure, those of ordinary skill in the art will be able to adapt an embodiment to other similarly proposed implementations or configurations, and such adaptations are contemplated within the scope of the illustrative embodiments.

For example, one presently available multiple-control inversion gate implementation decomposes the gate into a series of two-control Toffoli gates arranged in a V shape. A first part of the series (e.g., the left arm of the V shape) computes partial products, held as ancilla qubits, which are then computed into the desired product output. An ancilla qubit (plural: ancillae) is a qubit used to hold information temporarily, much like a processor register holds information temporarily in a classical processor. However, the ancillae are entangled with the final result. In order to obtain a correct result, this entanglement must be removed before measuring the final result. Thus, a second part of the series (e.g., the right arm of the V shape) uncomputes, or unentangles, the ancillae, removing the ancillae to their original states and allowing correct measuring of the desired final result. This implementation is arranged in series, with computation of each successive ancilla being dependent on the result of computation of a previous ancilla. The result is a deep quantum circuit. Circuit depth and series execution require additional execution time for a quantum circuit, limiting the number of controls for which this implementation can be used.

Other current inversion gate implementations do not use ancillae, or use only one ancilla. However, such quantum circuit implementations are even deeper than the V shape implementation, also limiting the number of controls for which this implementation can be used.

Because inversion gates are key components in Grover's Search and other useful quantum processing algorithms, the illustrative embodiments recognize that improving the efficiency of an inversion gate implementation in a quantum circuit also improves the efficiency of the algorithm using such an improved inversion gate. In addition, a quantum circuit that cannot be completely executed before uncorrected errors accumulate above a threshold does not produce usable results at all. Consequently, the illustrative embodiments recognize that what is needed in the art is a multiple-control inversion gate implementation that does not execute in series and is less deep and uses fewer gates than presently-used implementations.

The illustrative embodiments recognize that the presently available tools or solutions do not address these needs or provide adequate solutions for these needs. The illustrative embodiments used to describe the invention generally address and solve the above-described problems and other problems related to a multi-control quantum state inversion gate.

An embodiment can be implemented as a software application. The application implementing an embodiment can be configured as a modification of an existing system that converts a logical representation of a quantum circuit into a form executable by a q-processor, as a separate application that operates in conjunction with such a conversion system, a standalone application, or some combination thereof.

Particularly, some illustrative embodiments provide a method by which a multiple-control inversion gate with improved performance over current implementations is implemented in a quantum circuit.

An H-tree layout is helpful in visualizing a quantum circuit implementation of a multiple-control inversion gate. An H-tree layout depicts a binary tree in a two dimensional form. In particular, an H-tree represents a decomposition of a multiple-control inversion gate into a configuration of two-control or two- and three-control inversion gates. The center node of the H-tree represents the target of a multiple-control inversion gate. Leaf nodes of the H-tree represent controls of the gate. Intermediate nodes of the H-tree represent ancillae used in implementing the gate. Line segments connecting H-tree nodes denote subtrees that can be implemented in one or more two-control or two- and three-control inversion gates. For example, the H-tree layout c-t-c represents a two-control inversion gate with each "c" denoting a control of the gate and the "t" denoting a target of the gate.

Because of the binary-tree structure, any ancilla (the result of any subtree) can execute in parallel rather than in series, lowering circuit depth from linear (in the prior-art V-shape implementation) to square-root depth.

An embodiment receives a specification of a multiple-control inversion gate to be implemented in a quantum circuit. The specification specifies a set of control qubits and a target qubit of the inversion gate. The embodiment's goal is to implement the specified multiple-control inversion gate in a quantum circuit using a set of small inversion gates. As used herein, a small inversion gate has a number of control inputs that is less than the number of control inputs for the multiple-control inversion gate being implemented. In one embodiment, each of the small inversion gates has two control inputs. In another embodiment, each of the small inversion gates has either two or three control inputs. Thus, to implement the specified multiple-control inversion gate, an embodiment connects each of the specified control qubits to a control input of a small inversion gate, using ancillae as necessary.

In the quantum circuit being constructed, an embodiment connects two of the set of control qubits and the target qubit to the corresponding inputs of a two-control inversion gate.

An embodiment selects a control qubit, from the set of control qubits, that is not yet connected to a control input of a small inversion gate. If there is no currently-implemented small inversion gate with an unconnected input, an additional ancilla must be computed. To compute the additional ancilla, an embodiment implements an additional small inversion gate in the quantum circuit. To implement the new gate, an embodiment moves one control input from a control input of a previously-implemented gate to a control input of the new gate. The embodiment connects, at another control input of the new gate, the control qubit requiring placement. The target of the new gate is an ancilla which now serves as a control input of the previously-implemented gate, in place of the control input that was moved.

If, instead, there is a currently-implemented small inversion gate with an unconnected input, an additional ancilla is not yet needed. Instead, an embodiment determines the small inversion gate having the most control inputs not yet connected to a control qubit. If more than one small inversion gate has the same number of not-yet-connected control inputs, an embodiment selects any of the gates, using numerical order of the gates, reverse numerical order, a random or pseudo-random selection process, or another selection method. An embodiment connects the control qubit requiring placement to a not-yet-connected control input of the selected gate.

An embodiment continues in this manner, connecting control qubits from the set of control qubits requiring placement and adding ancillae as appropriate, until each control qubit in the set has been connected to an input of a small inversion gate in the quantum circuit. At this point, a first portion of the specified multi-control inversion gate is complete.

However, any ancilla in the circuit must still be uncomputed, i.e. unentangled from the target qubit that is the final result. Thus, an embodiment implements a mirror small inversion gate in the quantum circuit after the small inversion gate that produces the target qubit. A mirror small inversion gate has the same control and target qubits as an inversion gate to which the mirror corresponds. A mirror small inversion gate serves to uncompute an ancilla computed by a corresponding original gate. Another embodiment implements the uncompute gate when the original gate is implemented instead of waiting until the first portion of the specified multi-control inversion gate is complete.

Once both original and parallel uncompute gates have been implemented in the quantum circuit, the circuit is considered complete. An embodiment then replaces each small inversion gate in the circuit with an implementation of the small inversion gate using even smaller quantum circuit units. One implementation of a small inversion gate uses SWAPs and CNOTs. One non-limiting example implementation of such a small inversion gate has two controls and ten CNOTs, involves 2-qubit interactions only between a control and the target, and is also called a two-control regular Toffoli gate or a two-control true Toffoli gate.

Another implementation of a small inversion gate does not use SWAPs. One non-limiting example implementation of such a small inversion gate has two controls and three CNOTs, involves 2-qubit interactions only between a control and the target, and is also called a two-control relative-phase Toffoli gate. Another example implementation of such a small inversion gate has three controls and six CNOTs, involves 2-qubit interactions only between a control and the target, and is also called three-control relative-phase Toffoli gate. The relative-phase implementations of a small inversion gate cannot be used to compute the target qubit of a multi-control inversion gate. However, the relative-phrase implementations can be used to compute each of the ancillae. Using a relative-phase implementation instead of a regular implementation when possible uses significantly fewer CNOT gates (e.g. 3 gates versus 10 gates for the regular two-control implementation) and is thus a more efficient circuit.

Another embodiment, instead of replacing each small inversion gate in the circuit with an implementation once the circuit has been completed, replaces each small inversion gate in the circuit with an implementation as the circuit is being constructed. Other variations on the order of steps in the quantum circuit implementation are also possible and contemplated within the scope of the illustrative embodiments.

The manner of multi-control quantum state inversion gate described herein is unavailable in the presently available methods. A method of an embodiment described herein, when implemented to execute on a device or data processing system, comprises substantial advancement of the functionality of a quantum circuit by generating a more optimized quantum circuit producing the same results as the original in a shorter time, with faster execution and using fewer resources.

The illustrative embodiments are described with respect to certain types of quantum circuits, quantum gates, qubits, quantum processors, controls, targets, thresholds, constraints, operations, execution parameters, end criteria, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, operations, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
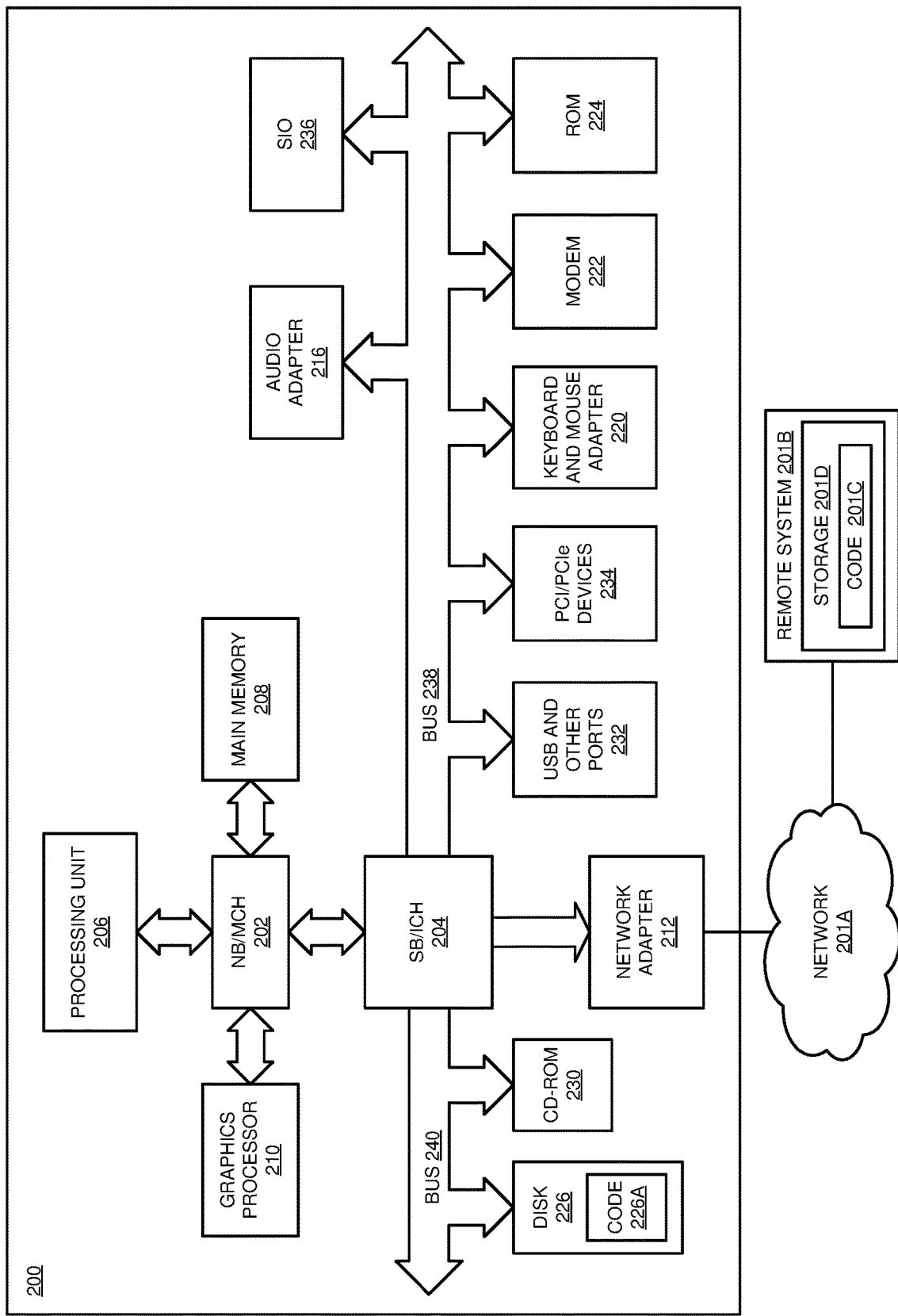
FIG. 2 depicts a block diagram of a conventional data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

QCE 140 is an example of a QCE described herein. As an example, QCE 140 includes CN 104, 106, and many other similar CNs 142. As an example, CNs 106 and 142 may be configured as cluster 144 of CNs. QCE 140 further includes one or more QCNs, such as QCN 146. A QCN, such as QCN 146, comprises one or more q-processors 148. A currently viable qubit is an example of q-processor 148. Application 105 implements an embodiment described herein. Application 105 operates on a CN, such as server 104 in QCE 140. Application 105 stores an operation library, circuits, and metadata in storage 108, or in any other suitable storage.

QCE 140 may couple to network 102 using wired connections, wireless communication protocols, or other suitable data connectivity. Clients 110, 112, and 114 may be, for example, personal computers or network computers. Network 102 may represent a collection of networks and gateways that use the Transmission Control Protocol/Internet Protocol (TCP/IP) and other protocols to communicate with one another. FIG. 1 is intended as an example, and not as an architectural limitation for the different illustrative embodiments.

Data processing environment 100 as a whole may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a conventional data processing system in which illustrative embodiments may be implemented. Data processing system 200 is an example of a classical computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as server 104 in FIG. 1 in which computer usable program code or instructions implementing the processes of the illustrative embodiments may be located. Data processing system 200 is described as a computer only as an example, without being limited thereto. Implementations in the form of other devices, such as server 104 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
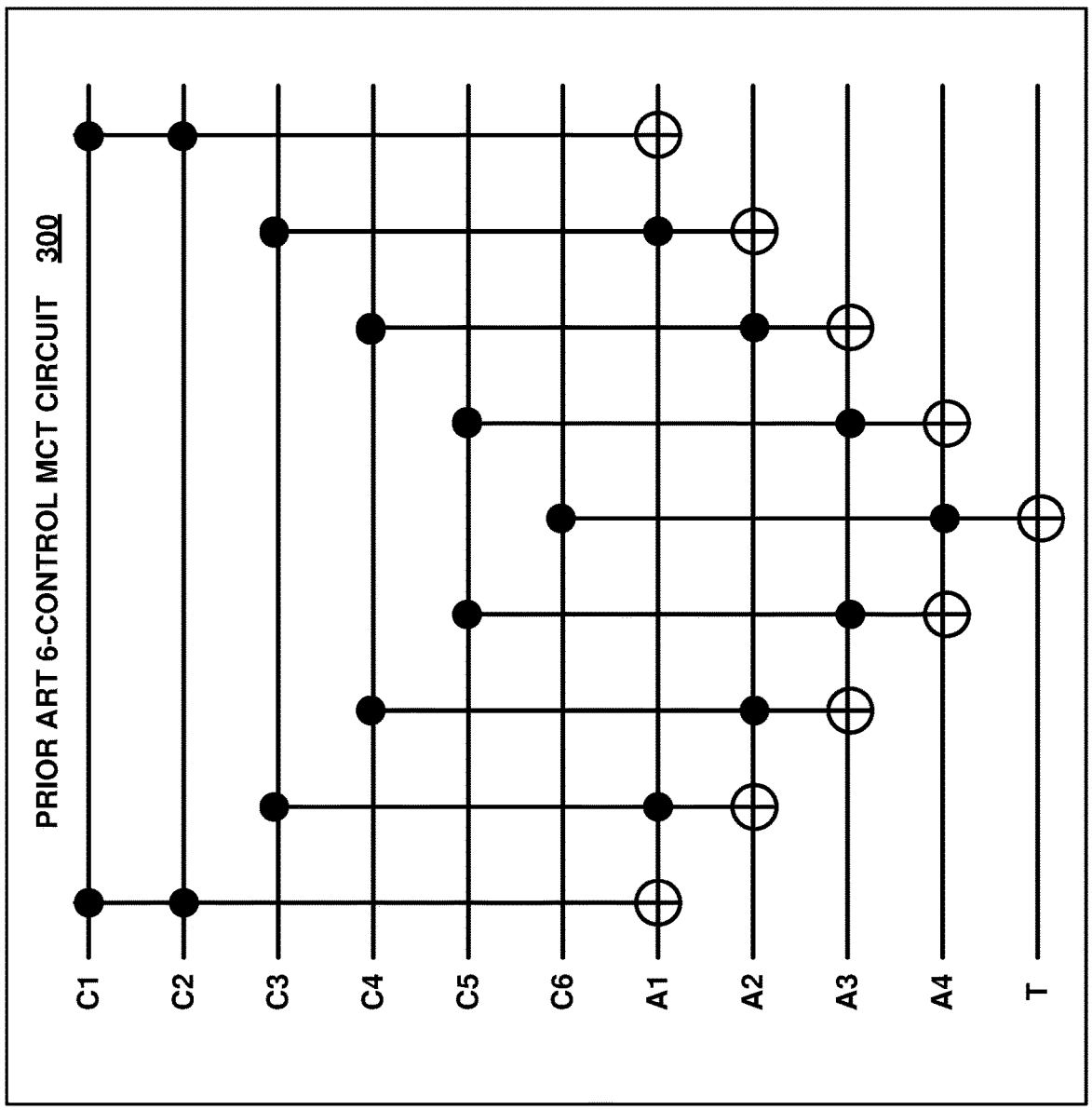
FIG. 3 depicts a prior-art quantum circuit implementing a multiple-control inversion gate.

With reference to FIG. 3, this figure depicts a prior-art quantum circuit implementing a multiple-control inversion gate. Circuit 300 can be executed in QCE 140 in FIG. 1.

Circuit 300 has six controls, C1-C6, used to control the state of target T. Circuit 300 also uses four ancillae, A1-A4, Circuit 300 includes a series of two-control Toffoli gates arranged in a V shape. A first part of the series (the left arm of the V shape) uses C1-C6 to compute A1-A4, which are ancillae holding partial products. The circuit then uses A1-A4 to compute T, the desired product output. A second part of the series (the right arm of the V shape) uncomputes A1-A4, untangling A1-A4 from T. This implementation is arranged in series, with each successive ancilla result dependent on computation of a previous ancilla, resulting in a deep quantum circuit.

Figure 4:
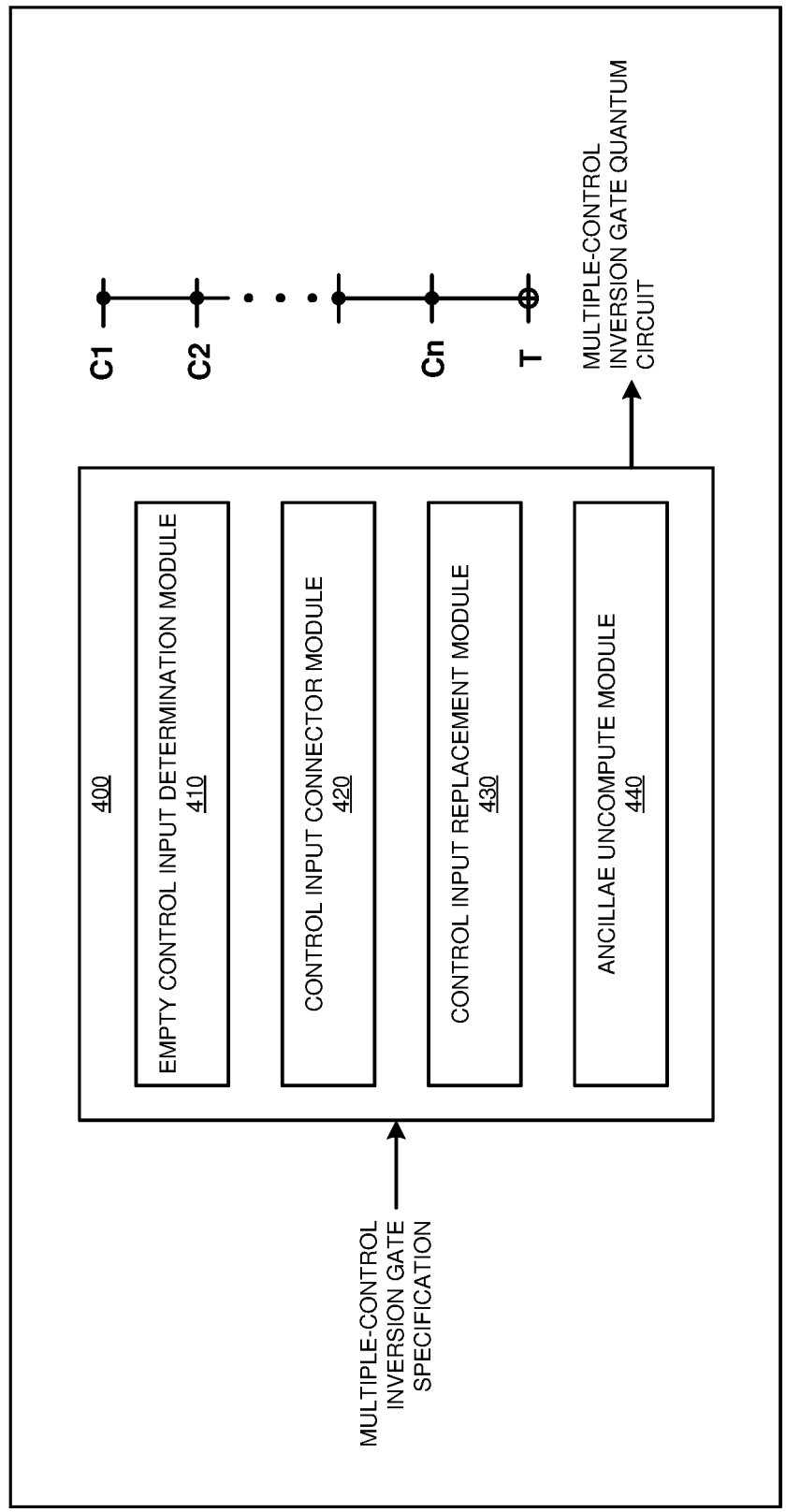
FIG. 4 depicts a block diagram of an example configuration for a multi-control quantum state inversion gate in accordance with an illustrative embodiment.

With reference to FIG. 4, this figure depicts a block diagram of an example configuration for a multi-control quantum state inversion gate in accordance with an illustrative embodiment. Application 400 can execute in any of systems 104, 106, 110, 112, and 114, and device 132, in FIG. 1.

Application 400 receives a specification of a multiple-control inversion gate to be implemented in a quantum circuit. The specification specifies a set of control qubits and a target qubit of the inversion gate. Application 400's goal is to implement the specified multiple-control inversion gate in a quantum circuit using a set of small inversion gates.

In the quantum circuit being constructed, control connector module 420 connects two of the set of control qubits and the target qubit to the corresponding inputs of a two-control inversion gate.

Application 400 selects a control qubit, from the set of control qubits, that is not yet connected to a control input of a small inversion gate. Empty control determination module 410 determines whether there is a currently-implemented small inversion gate with an unconnected input. If there is no currently-implemented small inversion gate with an unconnected input, an additional ancilla must be computed. To compute the additional ancilla, ancilla implementation module 430 implements an additional small inversion gate in the quantum circuit. To implement the new gate, module 430 moves one control input from a control input of a previously-implemented gate to a control input of the new gate. Module 430 connects, at another control input of the new gate, the control qubit requiring placement. The target of the new gate is an ancilla which now serves as a control input of the previously-implemented gate, in place of the control input that was moved.

If, instead, there is a currently-implemented small inversion gate with an unconnected input, an additional ancilla is not yet needed. Instead, module 410 determines the small inversion gate having the most control inputs not yet connected to a control qubit. If more than one small inversion gate has the same number of not-yet-connected control inputs, module 410 selects any of the gates, using any suitable selection method. Module 420 connects the control qubit requiring placement to a not-yet-connected control input of the selected gate.

Application 400 continues in this manner, connecting control qubits from the set of control qubits requiring placement and adding ancillae as appropriate, until each control qubit in the set has been connected to an input of a small inversion gate in the quantum circuit. In addition, for each implemented ancilla, mirror ancilla module 440 implements a mirror small inversion gate in the quantum circuit after the small inversion gate that produces the target qubit. Each of the original and mirror small inversion gates has the same control and target qubits. A mirror small inversion gate serves to uncompute an ancilla computed by a corresponding original gate.

Figure 5:
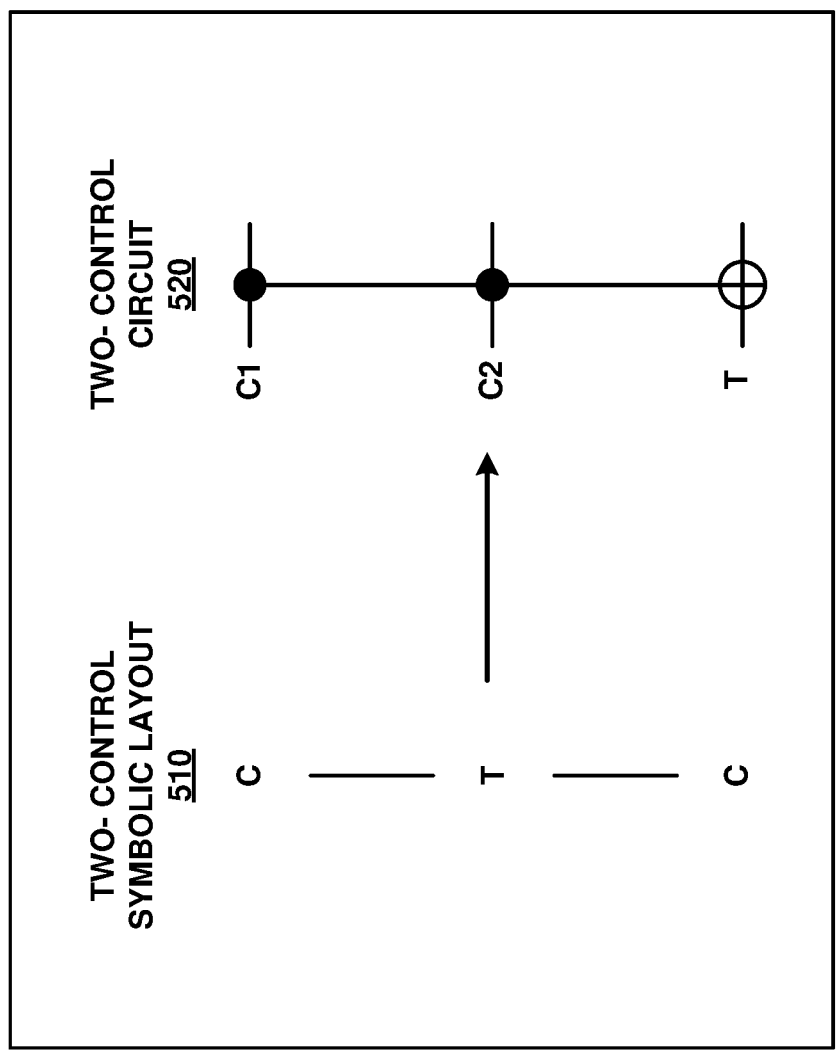
FIG. 5 depicts an example of a two-control symbolic layout and a corresponding two-control quantum circuit in accordance with an illustrative embodiment.

With reference to FIG. 5, this figure depicts an example of a two-control symbolic layout and a corresponding two-control quantum circuit in accordance with an illustrative embodiment. The two-control quantum circuit can be implemented using application 400 in FIG. 4.

Two-control symbolic layout 510 depicts a two-control layout with each "c" denoting a control of the gate and the "t" denoting a target of the gate. Two-control symbolic circuit 520 depicts a quantum circuit corresponding to layout 510. Circuit 520 includes a two-control inversion gate with controls C1 and C2 and target T.

Figure 6:
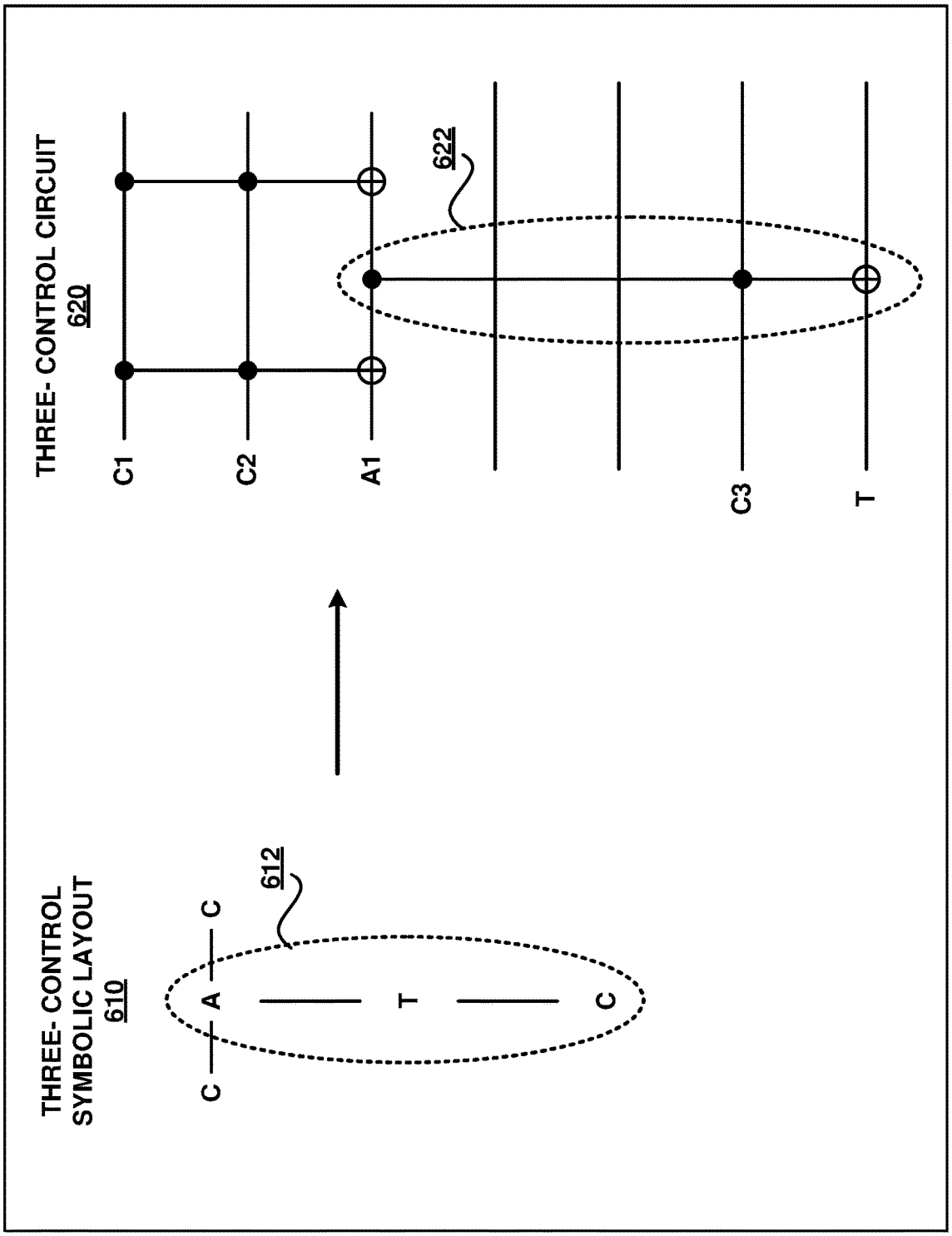
FIG. 6 depicts an example of a three-control symbolic layout and a corresponding three-control quantum circuit in accordance with an illustrative embodiment.

With reference to FIG. 6, this figure depicts an example of a three-control symbolic layout and a corresponding three-control quantum circuit in accordance with an illustrative embodiment. The three-control quantum circuit can be implemented using application 400 in FIG. 4.

Three-control symbolic layout 610 depicts a three-control layout with each "c" denoting a control of the gate and the "t" denoting a target of the gate. Here, one of the controls of two-control symbolic layout 510 has been replaced by an "a", denoting an ancilla, and an additional control. Three-control symbolic circuit 620 depicts a quantum circuit corresponding to layout 610. Circuit 620 includes an additional control, C3, and an additional ancilla, A1. Circuit 620 also includes two-control inversion gate 622 with controls A1 and C3 and target T. Gate 622 corresponds to area 612 of layout 610.

Figure 7:
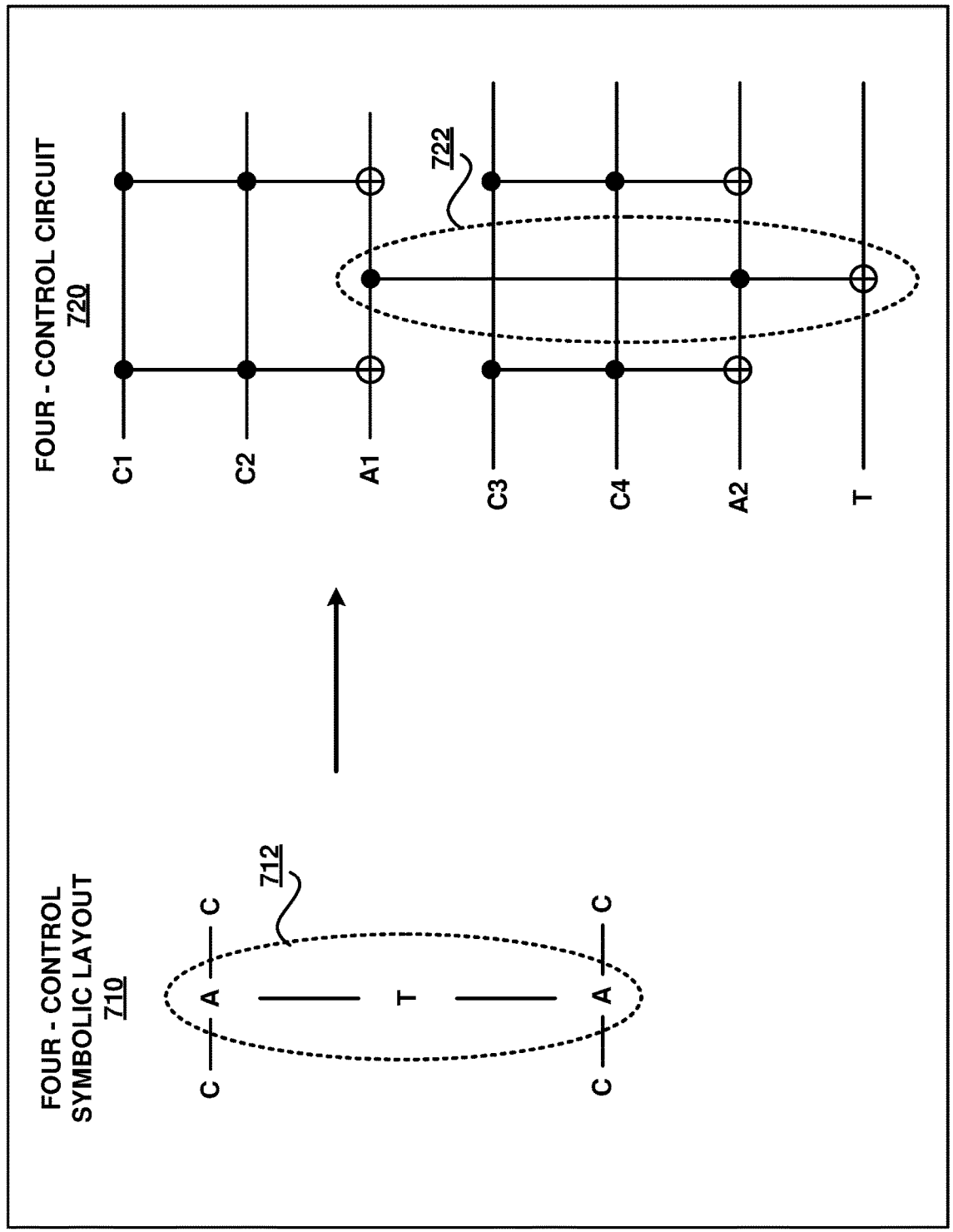
FIG. 7 depicts an example of a four-control symbolic layout and a corresponding four-control quantum circuit in accordance with an illustrative embodiment.

With reference to FIG. 7, this figure depicts an example of a four-control symbolic layout and a corresponding four-control quantum circuit in accordance with an illustrative embodiment. The four-control quantum circuit can be implemented using application 400 in FIG. 4.

Four-control symbolic layout 710 depicts a four-control layout with each "c" denoting a control, each "a" denoting an ancilla, and the "t" denoting a target of the gate. Here, one of the controls of three-control symbolic layout 610 has been replaced by an "a" and an additional control.

Four-control symbolic circuit 720 depicts a quantum circuit corresponding to layout 710. Circuit 720 includes an additional control, C4, and an additional ancilla, A2. Circuit 720 also includes two-control inversion gate 722 with controls A1 and A2 and target T. Gate 722 corresponds to area 712 of layout 710.

Figure 8:
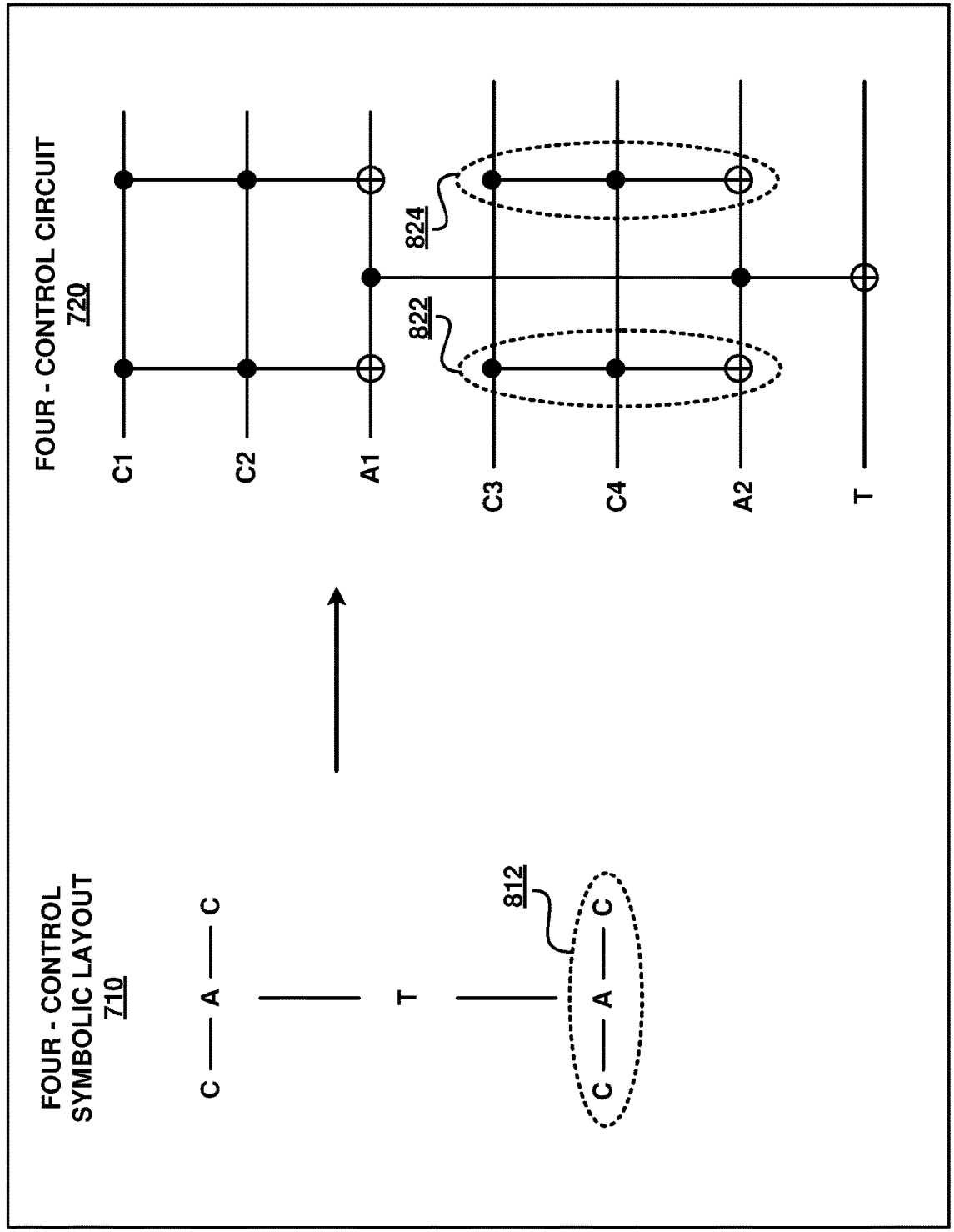
FIG. 8 depicts a further example of a four-control symbolic layout and a corresponding four-control quantum circuit in accordance with an illustrative embodiment.

With reference to FIG. 8, this figure depicts a further example of a four-control symbolic layout and a corresponding four-control quantum circuit in accordance with an illustrative embodiment. The four-control quantum circuit can be implemented using application 400 in FIG. 4. Layout 710 and circuit 720 are the same as layout 710 and circuit 720 in FIG. 7.

Circuit 720 also includes inversion gates 822 and 824. Each of inversion gates 822 and 824 is a two-control inversion gate with controls C3 and C4 and target A2. Gate 822 corresponds to area 812 of layout 710. Gate 824 is the mirror of gate 822.

Figure 9:
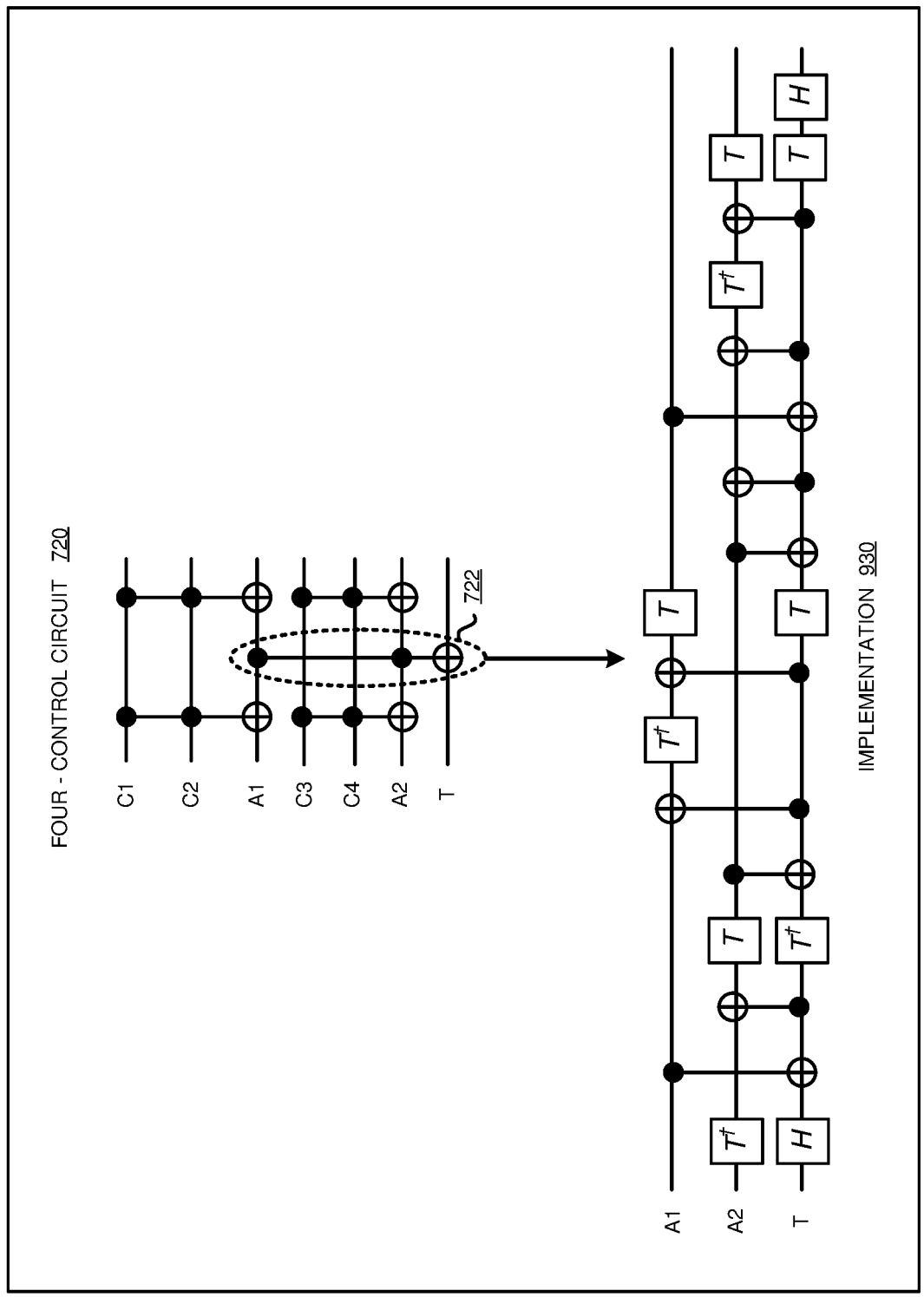
FIG. 9 depicts an implementation of a four-control quantum circuit in accordance with an illustrative embodiment.

With reference to FIG. 9, this figure depicts an implementation of a four-control quantum circuit in accordance with an illustrative embodiment. Circuit 720 and gate 722 are the same as circuit 720 and gate 722 in FIG. 7.

Circuit 720 includes two-control inversion gate 722 with controls A1 and A2 and target T. Gate 722 is an example of a small inversion gate that can be implemented using implementation 930. In implementation 930 (as in other quantum circuits depicted herein), a plus sign in a circle with one input denotes a CNOT, and a boxed H denotes a Hadamard gate. A boxed T denotes a quantum gate that applies a pi/4 phase change to a qubit. A boxed T-dagger denotes the conjugate of T (i.e., applying a −pi/4 phase change). Implementation 930 has two controls, A1 and A2, and ten CNOTs, involves 2-qubit interactions only between a control and the target, and is an example of a two-control regular Toffoli gate.

Figure 10:
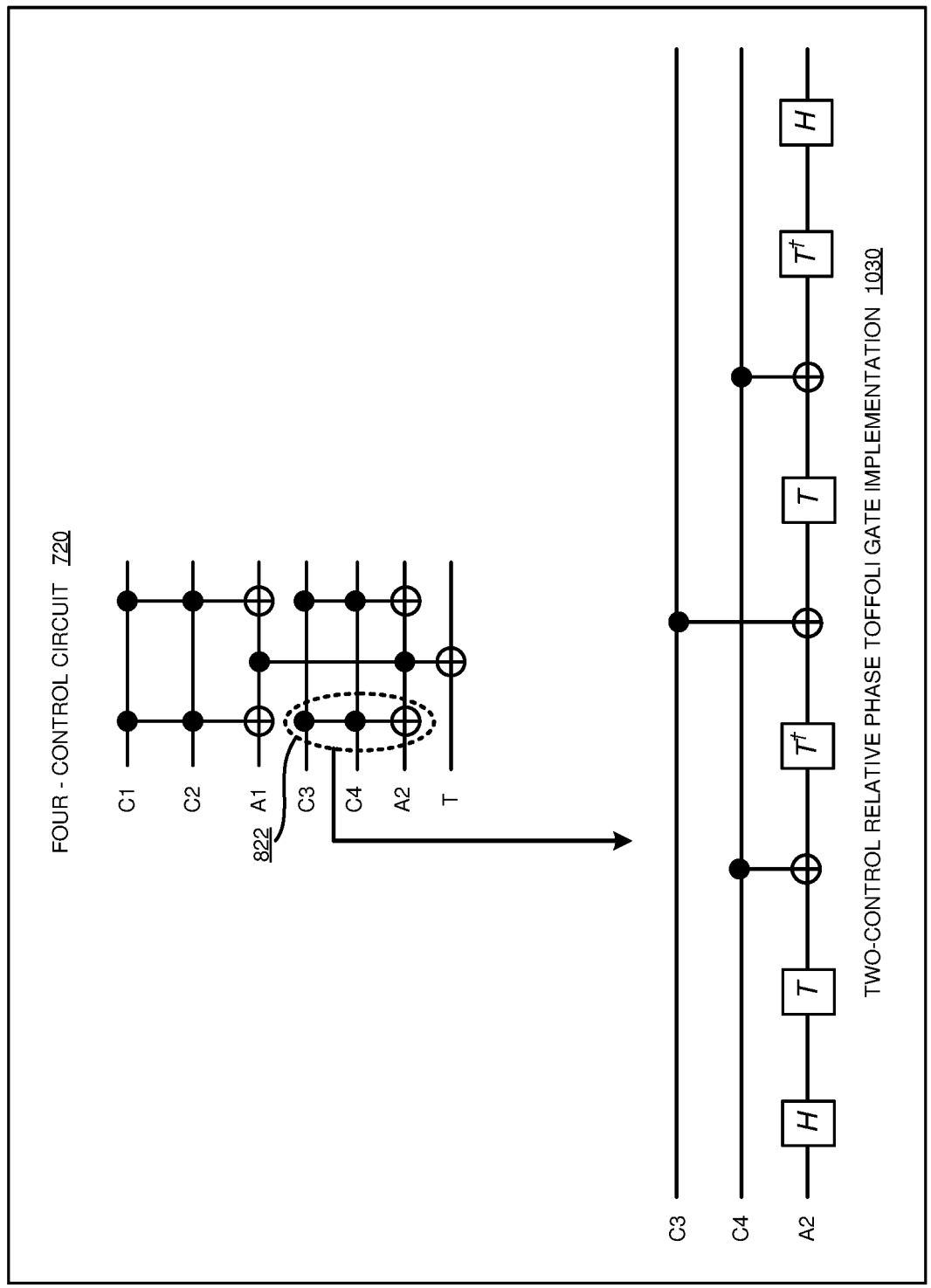
FIG. 10 depicts another implementation of a four-control quantum circuit in accordance with an illustrative embodiment.

With reference to FIG. 10, this figure depicts another implementation of a four-control quantum circuit in accordance with an illustrative embodiment. Circuit 720 is the same as circuit 720 in FIG. 7. Gate 822 is the same as gate 822 in FIG. 8.

Circuit 720 includes two-control inversion gate 822 with controls C3 and C4 and target A2. Gate 822 is an example of a small inversion gate that can be implemented using implementation 1030, and can be used to compute each of the ancillae. Implementation 1030 has two controls, C3 and C4, and only three CNOTs, involves 2-qubit interactions only between a control and the target, and is an example of a two-control relative-phase Toffoli gate.

Figure 11:
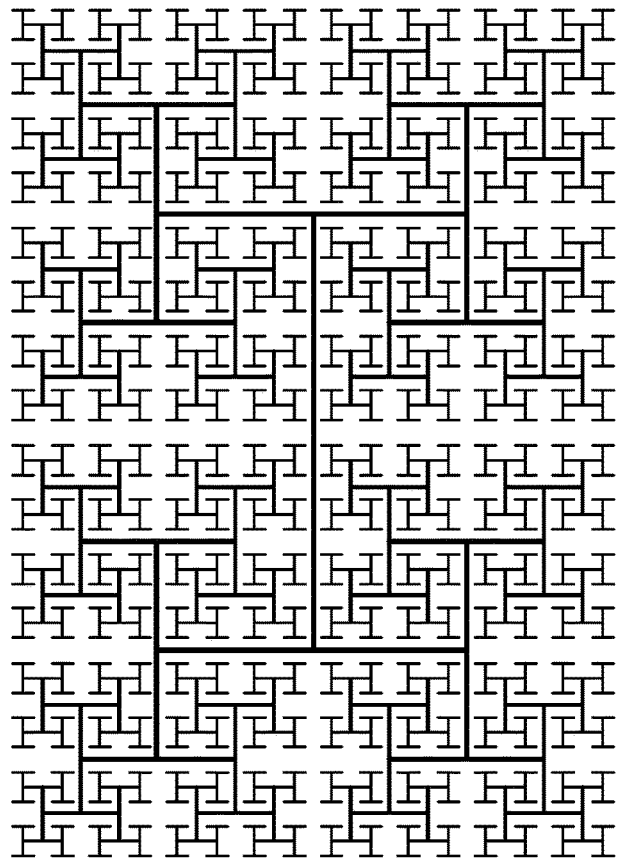
FIG. 11 depicts additional examples of symbolic layouts in accordance with an illustrative embodiment.

With reference to FIG. 11, this figure depicts additional examples of symbolic layouts in accordance with an illustrative embodiment. Each of the symbolic layouts corresponds to a quantum circuit which can be implemented using application 400 in FIG. 4. Four-control symbolic layout 710 is the same as four-control symbolic layout 710 in FIG. 7.

Four-control symbolic layout 710 depicts a four-control layout with each "c" denoting a control, each "a" denoting an ancilla, and the "t" denoting a target of the gate. Here, one of the controls of three-control symbolic layout 610 has been replaced by an ancilla and an additional control.

Six-control symbolic layout 1120 depicts a six-control layout with each "c" denoting a control, each "a" denoting an ancilla, and the "t" denoting a target of the gate. Here, two additional ancillae and controls have been added, and two of existing controls of four-control symbolic layout 710 are now inputs to the added ancillae. The layout has also been rotated with respect to layout 710.

Eight-control symbolic layout 1130 depicts an eight-control inversion gate with each "c" denoting a control, each "a" denoting an ancilla, and the "t" denoting a target of the gate. Here, two additional ancillae and controls have been added, and two of existing controls of layout 1120 are now inputs to the added ancillae.

N-control symbolic layout 1140 depicts an extension of layout 1130. Layout 1140 has N controls, with corresponding ancillae, and a target (not shown) in the center of the layout. Here, N can be any whole number greater than eight. Application 400 can implement a corresponding quantum circuit of any depth that is executable on a quantum processor.

Figure 12:
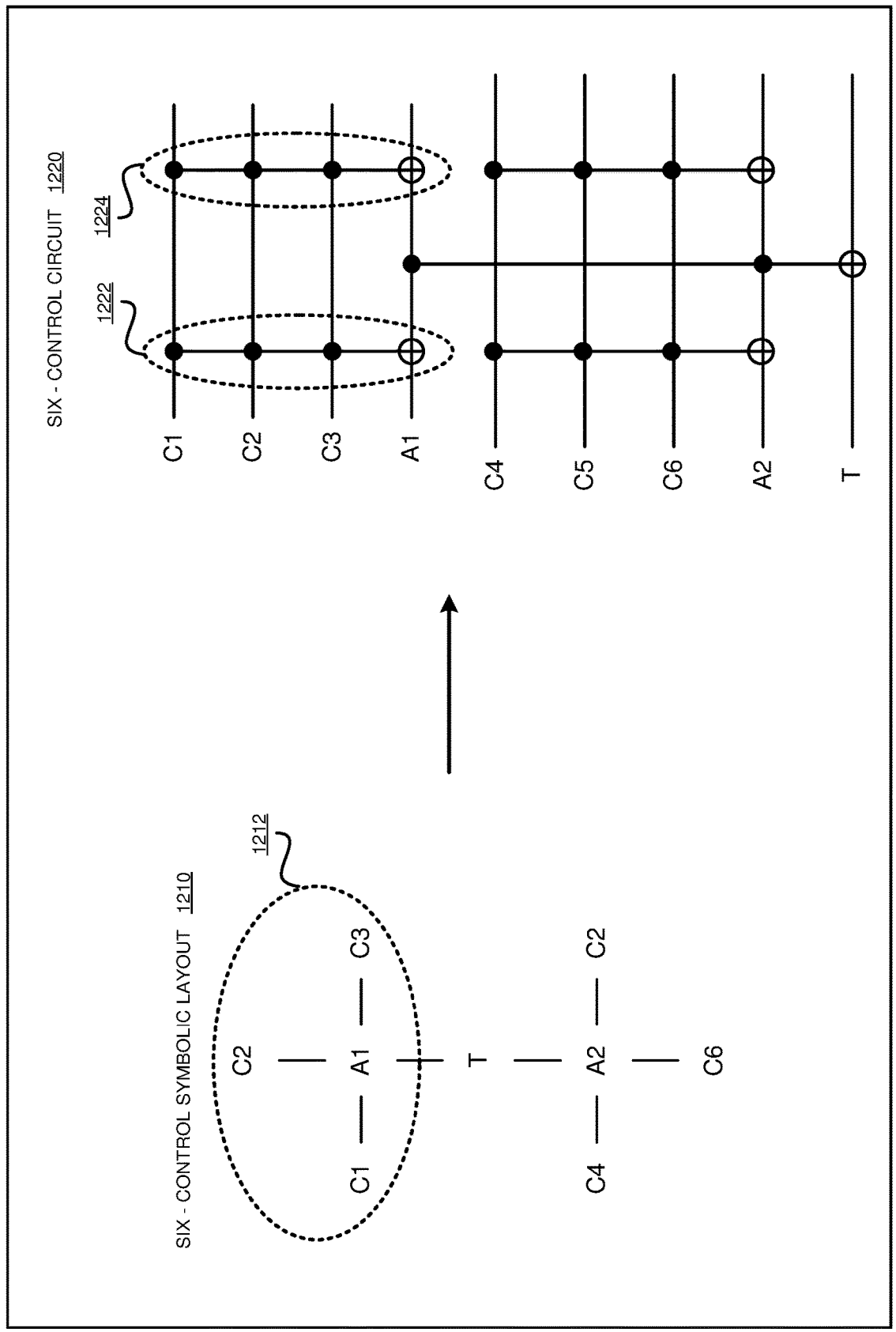
FIG. 12 depicts another example of a six-control symbolic layout and a corresponding six-control quantum circuit in accordance with an illustrative embodiment.

With reference to FIG. 12, this figure depicts another example of a six-control symbolic layout and a corresponding six-control quantum circuit in accordance with an illustrative embodiment. The six-control quantum circuit can be implemented using application 400 in FIG. 4.

Layout 1212 depicts a symbolic layout of a multi-control inversion gate that can be implemented using small inversion gates with three controls as well as those with two controls. Area 1212 depicts an ancilla, A1, with three controls C1-C3.

Circuit 1220 includes inversion gates 1222 and 1224. Each of inversion gates 1222 and 1224 is a three-control inversion gate with controls C1, C2, and C3 and target A1. Gate 1222 corresponds to area 1212 of layout 1210. Gate 1224 is the mirror of gate 1222.

Figure 13:
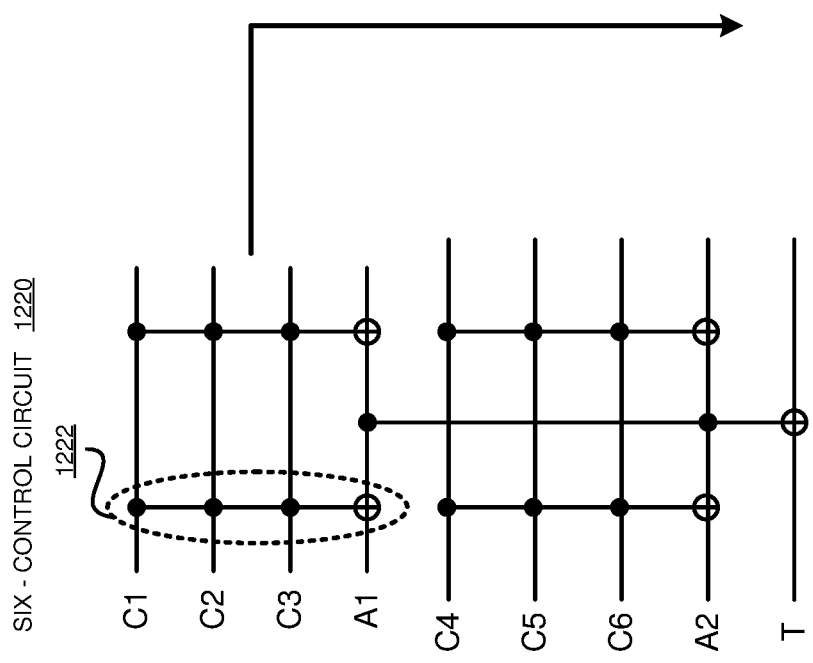
FIG. 13 depicts an implementation of a six-control quantum circuit in accordance with an illustrative embodiment.
Figure 13:
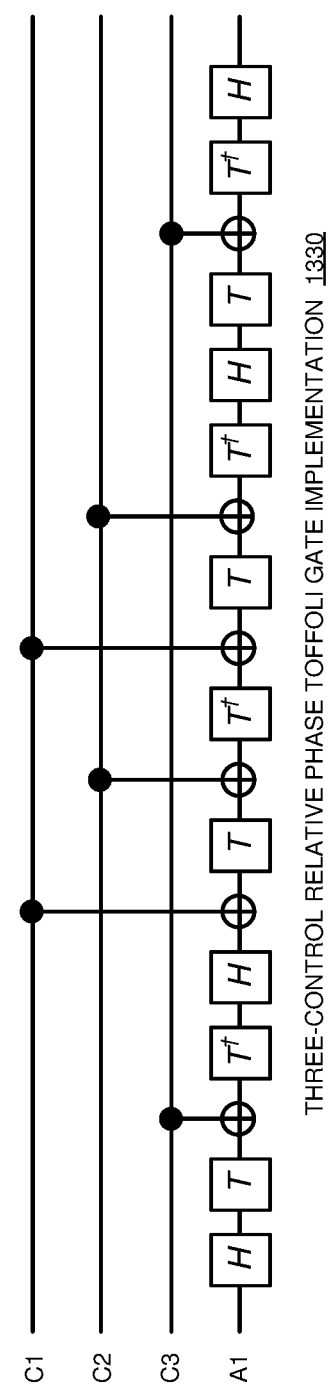

With reference to FIG. 13, this figure depicts an implementation of a six-control quantum circuit in accordance with an illustrative embodiment. Circuit 1220 is the same as circuit 1220 in FIG. 12. Gate 1222 is the same as gate 1222 in FIG. 12.

Circuit 1220 includes three-control inversion gate 1222 with controls C1, C2, and C3 and target A1. Gate 1222 is an example of a small inversion gate that can be implemented using implementation 1330, and can be used to compute each of the ancillae. Implementation 1330 has three controls, C1, C2, and C3, and only six CNOTs, involves 2-qubit interactions only between a control and the target, and is an example of a three-control relative-phase Toffoli gate.

Figure 14:
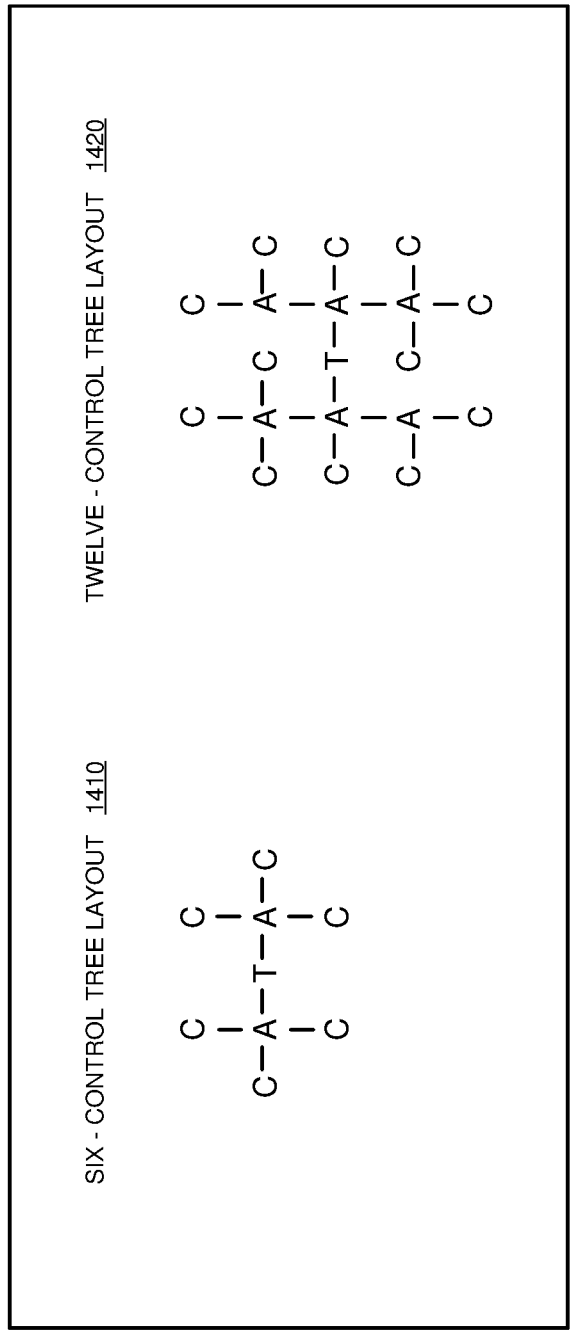
FIG. 14 depicts additional examples of symbolic layouts in accordance with an illustrative embodiment.

With reference to FIG. 14, this figure depicts additional examples of symbolic layouts in accordance with an illustrative embodiment. Each of the symbolic layouts corresponds to a quantum circuit which can be implemented using application 400 in FIG. 4. Four-control symbolic layout 710 is the same as four-control symbolic layout 710 in FIG. 7.

Six-control symbolic layout 1410 depicts a six-control layout with each "c" denoting a control, each "a" denoting an ancilla, and the "t" denoting a target of the gate. Here, unlike six-control layout 1120, each ancilla has three controls.

Twelve-control symbolic layout 1420 depicts a twelve-control layout with each "c" denoting a control, each "a" denoting an ancilla, and the "t" denoting a target of the gate. Here, four additional ancillae and six additional controls have been added, and four of the existing controls of six-control symbolic layout 1410 are now inputs to the added ancillae. The layout has also been rotated with respect to layout 1410.

Figure 15:
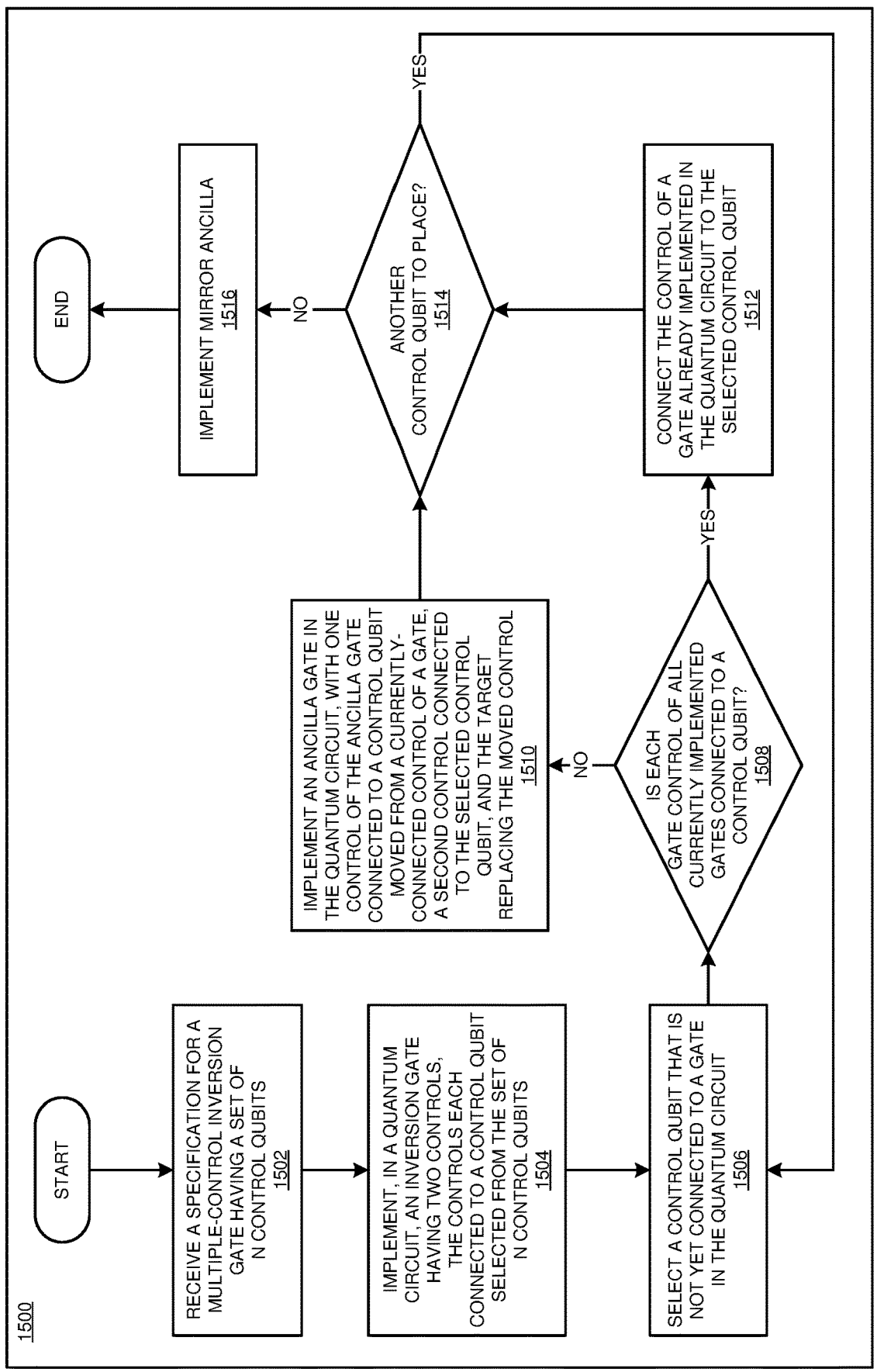
FIG. 15 depicts a flowchart of an example application for a multi-control quantum state inversion gate in accordance with an illustrative embodiment.

With reference to FIG. 15, this figure depicts a flowchart of an example application 1500 for a multi-control quantum state inversion gate in accordance with an illustrative embodiment. Process 1500 can be implemented in application 400 in FIG. 4.

In block 1502, the application receives a specification for a multiple-control inversion gate having a set of n control qubits, where n may be any positive whole number. In block 1504, the application implements, in a quantum circuit, an inversion gate having two controls, the controls each connected to a control qubit selected from the set of n control qubits. In block 1506, the application selects a control qubit that is not yet connected to a gate in the quantum circuit. In block 1508, the application determines whether each gate control of all currently-implemented gates is connected to a control qubit. If yes ("YES" path of block 1508), in block 1510 the application implements an ancilla gate in the quantum circuit, with one control of the ancilla gate connected to a control qubit moved from a currently-connected control of agate, a second control connected to the selected control qubit, and the target replacing the moved control. If not ("NO" path of block 1508), in block 1512 the application connects the control of a gate already implemented in the quantum circuit to the selected control qubit. In block 1514, the application determines whether there is another control qubit to place. If yes ("YES" path of block 1514), the application returns to block 1506. If not ("NO" path of block 1514), the application ends.

Thus, a computer implemented method, system or apparatus, and computer program product are provided in the illustrative embodiments for a multi-control quantum state inversion gate and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    implementing, in a quantum circuit, an inversion gate, the inversion gate configured to invert a quantum state of a target input if every control is in a $|1\rangle$ quantum state, the inversion gate having two controls, the controls each connected to a control qubit selected from a set of unplaced control qubits;
    implementing, in the quantum circuit responsive to determining that each control of the inversion gate is currently connected to a control qubit, a first ancilla gate, the first ancilla gate comprising an inversion gate, a first control of the first ancilla gate connected to a control qubit moved from a first control of the inversion gate, a second control of the first ancilla gate connected to a control qubit selected from the set of unplaced control qubits, a target of the first ancilla gate connected to the first control of the inversion gate; and
    connecting, at a gate implemented in the quantum circuit responsive to determining that the gate has a maximum number of controls not connected to control qubits, a control of the gate to a control qubit selected from the set of unplaced control qubits.

2. The method of claim 1, further comprising:
    implementing, in the quantum circuit, a mirror ancilla gate, the mirror ancilla gate having the same controls and target as the first ancilla gate, the mirror ancilla gate placed following the inversion gate.

3. The method of claim 1, wherein the inversion gate comprises a regular inversion gate.

4. The method of claim 3, wherein the regular inversion gate comprises two controls.

5. The method of claim 4, wherein the regular inversion gate comprises a SWAP and ten CNOTs.

6. The method of claim 1, wherein the first ancilla gate comprises a regular inversion gate.

7. The method of claim 6, wherein the regular inversion gate comprises two controls.

8. The method of claim 1, wherein the first ancilla gate comprises a relative-phase inversion gate.

9. The method of claim 8, wherein the relative-phase inversion gate comprises two controls.

10. The method of claim 9, wherein the relative-phase inversion gate comprises three CNOTs and does not include a SWAP.

11. The method of claim 9, wherein the relative-phase inversion gate comprises three controls.

12. The method of claim 11, wherein the relative-phase inversion gate comprises six CNOTs and does not include a SWAP.

13. A computer usable program product comprising one or more computer-readable storage medium, and program instructions stored on at least one of the one or more storage medium, the stored program instructions comprising:
    program instructions to implement, in a quantum circuit, an inversion gate, the inversion gate configured to invert a quantum state of a target input if every control is in a $|1\rangle$ quantum state, the inversion gate having two controls, the controls each connected to a control qubit selected from a set of unplaced control qubits;
    program instructions to implement, in the quantum circuit responsive to determining that each control of the inversion gate is currently connected to a control qubit, a first ancilla gate, the first ancilla gate comprising an inversion gate, a first control of the first ancilla gate connected to a control qubit moved from a first control of the inversion gate, a second control of the first ancilla gate connected to a control qubit selected from the set of unplaced control qubits, a target of the first ancilla gate connected to the first control of the inversion gate; and
    program instructions to connect, at a gate implemented in the quantum circuit responsive to determining that the gate has a maximum number of controls not connected to control qubits, a control of the gate to a control qubit selected from the set of unplaced control qubits.

14. The computer usable program product of claim 13, wherein the inversion gate comprises a regular inversion gate.

15. The computer usable program product of claim 14, wherein the regular inversion gate comprises two controls.

16. The computer usable program product of claim 15, wherein the regular inversion gate comprises a SWAP and ten CNOTs resource requirement of the first analysis operation.

17. The computer usable program product of claim 13, wherein the first ancilla gate comprises a regular inversion gate.

18. The computer usable program product of claim 13, wherein the computer usable code is stored in a computer readable storage medium in a data processing system, and wherein the computer usable code is transferred over a network from a remote data processing system.

19. The computer usable program product of claim 13, wherein the computer usable code is stored in a computer readable storage medium in a server data processing system, and wherein the computer usable code is downloaded over a network to a remote data processing system for use in a computer readable storage medium associated with the remote data processing system.

20. A computer system comprising one or more processors, one or more computer-readable memories, and one or more computer-readable storage medium, and program instructions stored on at least one of the one or more storage medium for execution by at least one of the one or more processors via at least one of the one or more memories, the stored program instructions comprising:

program instructions to implement, in a quantum circuit, an inversion gate, the inversion gate configured to invert a quantum state of a target input if every control is in a $|1\rangle$ quantum state, the inversion gate having two controls, the controls each connected to a control qubit selected from a set of unplaced control qubits;

program instructions to implement, in the quantum circuit responsive to determining that each control of the inversion gate is currently connected to a control qubit, a first ancilla gate, the first ancilla gate comprising an inversion gate, a first control of the first ancilla gate connected to a control qubit moved from a first control of the inversion gate, a second control of the first ancilla gate connected to a control qubit selected from the set of unplaced control qubits, a target of the first ancilla gate connected to the first control of the inversion gate; and program instructions to connect, at a gate implemented in the quantum circuit responsive to determining that the gate has a maximum number of controls not connected to control qubits, a control of the gate to a control qubit selected from the set of unplaced control qubits.

* * * * *